United States Patent
Lee et al.

(10) Patent No.: US 10,834,857 B2
(45) Date of Patent: Nov. 10, 2020

(54) INVERTER DEVICE HAVING HEAT DISSIPATION MECHANISM

(71) Applicant: Delta Electronics, Inc., Taoyuan (TW)

(72) Inventors: Lei-Ming Lee, Taoyuan (TW); Xin-Hung Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/503,068

(22) Filed: Jul. 3, 2019

(65) Prior Publication Data

US 2020/0196491 A1   Jun. 18, 2020

(30) Foreign Application Priority Data

Dec. 14, 2018   (CN) .......................... 2018 1 1533387

(51) Int. Cl.
*H05K 7/20* (2006.01)
*H05K 1/14* (2006.01)
(Continued)

(52) U.S. Cl.
CPC ........ *H05K 7/20909* (2013.01); *H02M 7/003* (2013.01); *H05K 1/14* (2013.01);
(Continued)

(58) Field of Classification Search
CPC ................. H01L 23/467; H01L 23/427; H01L 2224/49171; H01L 23/367; H01L 23/473;
(Continued)

(56) References Cited

U.S. PATENT DOCUMENTS 5,091,823 A * 2/1992 Kanbara ................. H02M 5/44
                                                              174/351
5,742,478 A * 4/1998 Wu ..................... H05K 7/20154
                                                              361/704
(Continued)

FOREIGN PATENT DOCUMENTS

CN          20194715 U      8/2011
CN         108983904 A     12/2018
(Continued)

OTHER PUBLICATIONS

Office Action dated Jul. 31, 2019 of the corresponding Taiwan patent application.
Search Report dated Jan. 28, 2020 of the corresponding European patent applicaiton.
Office Action dated Jun. 30, 2020 of the corresponding Japan patent application No. 2019-125181.

* cited by examiner

*Primary Examiner* — Adam B Dravininkas
(74) *Attorney, Agent, or Firm* — Chun-Ming Shih; HDLS IPR Services

(57) ABSTRACT

An inverter device includes a casing, a heat source element, a heat dissipation structure and a fan. The casing has a base and a cover covering the base. An internal and an external surface are defined on the cover. The inner surface is disposed corresponding to the base. The heat source element is disposed in the casing and arranged on the base. The heat dissipation structure is thermal connected with the internal surface. The fan is accommodated in the casing corresponding to the heat dissipation structure. An air flow in the casing is accelerated by the fan, and the heat dissipation structure absorbs heat from the air flow in the casing and thermal conductively transfers to the external surface of the cover. A heat dissipation efficiency of the inverter device is thereby improved and the inverter device is thereby more durable.

12 Claims, 9 Drawing Sheets

(51) Int. Cl.
*H05K 5/03* (2006.01)
*H02M 7/00* (2006.01)
*H05K 1/18* (2006.01)
*H05K 7/14* (2006.01)

(52) U.S. Cl.
CPC ............... *H05K 1/181* (2013.01); *H05K 5/03* (2013.01); *H05K 7/1427* (2013.01); *H05K 7/20154* (2013.01); *H05K 7/20172* (2013.01); *H05K 2201/1003* (2013.01); *H05K 2201/10015* (2013.01); *H05K 2201/10053* (2013.01)

(58) Field of Classification Search
CPC ..... H01L 23/3672; H01L 23/373; G06F 1/20; G06F 1/203; G06F 2200/201; G06F 1/184; F28D 15/0233; F28D 2021/0029; F28D 1/0233; H05K 7/20154; H05K 7/20145; H05K 7/20909; H05K 7/20009; H05K 7/1432; H05K 7/20172; H05K 1/0203; F28F 3/02
See application file for complete search history.

(56) References Cited

U.S. PATENT DOCUMENTS

| | | | | |
|---|---|---|---|---|
| 2003/0196779 | A1* | 10/2003 | Horng | H01L 23/467 165/80.3 |
| 2004/0169956 | A1* | 9/2004 | Oba | G06F 1/20 360/97.15 |
| 2008/0030951 | A1 | 2/2008 | Hall et al. | |
| 2015/0116937 | A1 | 4/2015 | Huesgen et al. | |
| 2015/0145469 | A1* | 5/2015 | You | H02J 7/0042 320/107 |
| 2016/0091264 | A1* | 3/2016 | Lu | H05K 7/20918 165/121 |
| 2018/0278172 | A1 | 9/2018 | Tokuyama et al. | |
| 2018/0295755 | A1* | 10/2018 | Lin | H05K 7/20909 |

FOREIGN PATENT DOCUMENTS

| | | |
|---|---|---|
| JP | H1089820 A | 4/1998 |
| JP | 2010016947 A | 1/2010 |
| JP | 2016021836 A | 2/2016 |
| JP | 2017158413 A | 9/2017 |
| WO | 2017056686 A1 | 4/2017 |

US 10,834,857 B2

INVERTER DEVICE HAVING HEAT DISSIPATION MECHANISM

TECHNICAL FIELD

The present disclosure relates to an inverter structure, and more particularly to an inverter device having a heat dissipation mechanism.

BACKGROUND

An inverter is an electronic device for converting DC power to AC power by, for example but not limited to, a high frequency bridge circuit. The elements which requires heat dissipation such as circuit boards, IGBTs (Insulated Gate Bipolar Transistors), MOSFETs (Metal Oxide Semiconductor Field Effect Transistors), passive components, and other components are usually arranged on a bottom case of the inverter. Therefore, a plurality of heat dissipation fins for further heat dissipation is disposed on an external surface of the bottom case of the inverter.

However, the most part of the heat is distributed in the bottom case of the aforementioned inverter, and an upper cover of the inverter is in a relatively low temperature. Therefore, a heat dissipation efficiency of the entire inverter will increase if the heat is conducted to the low-temperature upper cover. Temperature inside the device could be decreased and a durability of the product could be extended.

In views of this, in order to solve the above disadvantage, the present inventor studied related technology and provided a reasonable and effective solution in the present disclosure.

SUMMARY

According to an inverter device having heat dissipation mechanism provided in the present disclosure, a heat dissipation structure is attached on an internal surface of a cover, the heat dissipation structure absorbs heat form air in the casing and transfers the heat to an external surface of the cove. Thereby, an efficiency of heat dissipation of the inverter device is thereby improved and the inverter device is more durable.

According to an inverter device having heat dissipation mechanism shown in an embodiment of the present disclosure, the inverter device having heat dissipation mechanism has a casing having a base and a cover covering on the base, an internal surface and an external surface are oppositely defined on the cover, the internal surface is arranged corresponding to the base. At least one heat source element is accommodated in the casing and arranged on the base. The heat dissipation structure is thermally contacted with the internal surface. A fan is accommodated in the casing and arranged corresponding to the heat dissipation structure.

Accordingly, airflow in the casing is accelerated by the fan, and the airflow is thereby driven to flow through the heat dissipation structure, heat is absorbed from the airflow by the heat dissipation structure and the heat is further transferred to an external surface of the cover, heat could be dissipated more efficiently from the inverter device via the cover in relatively low temperature. Thereby, an efficiency of heat dissipation of the inverter device is improved and the inverter device is therefore more durable.

Accordingly, the plurality of heat dissipation fins is bent to form a curved segment, the curved segment is disposed on the cover to extend a heat dissipation area of the heat dissipation fin, airflow channels could be extended thereby to maintain the heat in the heat dissipation structure, and the heat is further dissipated from the cover.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
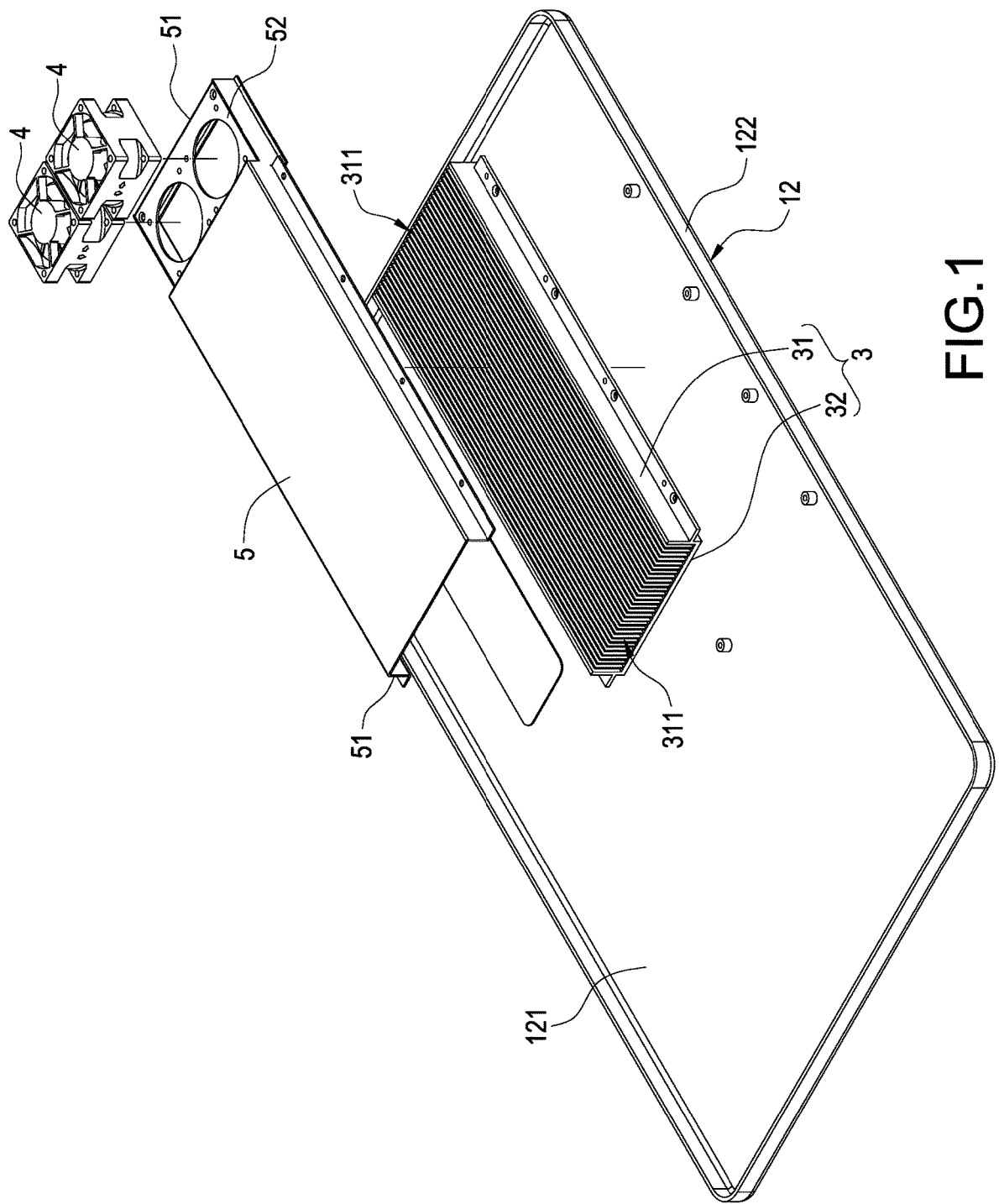
FIG. 1 is an exploded view showing a cover, a heat dissipation structure and a fan according to the present disclosure.
Figure 2:
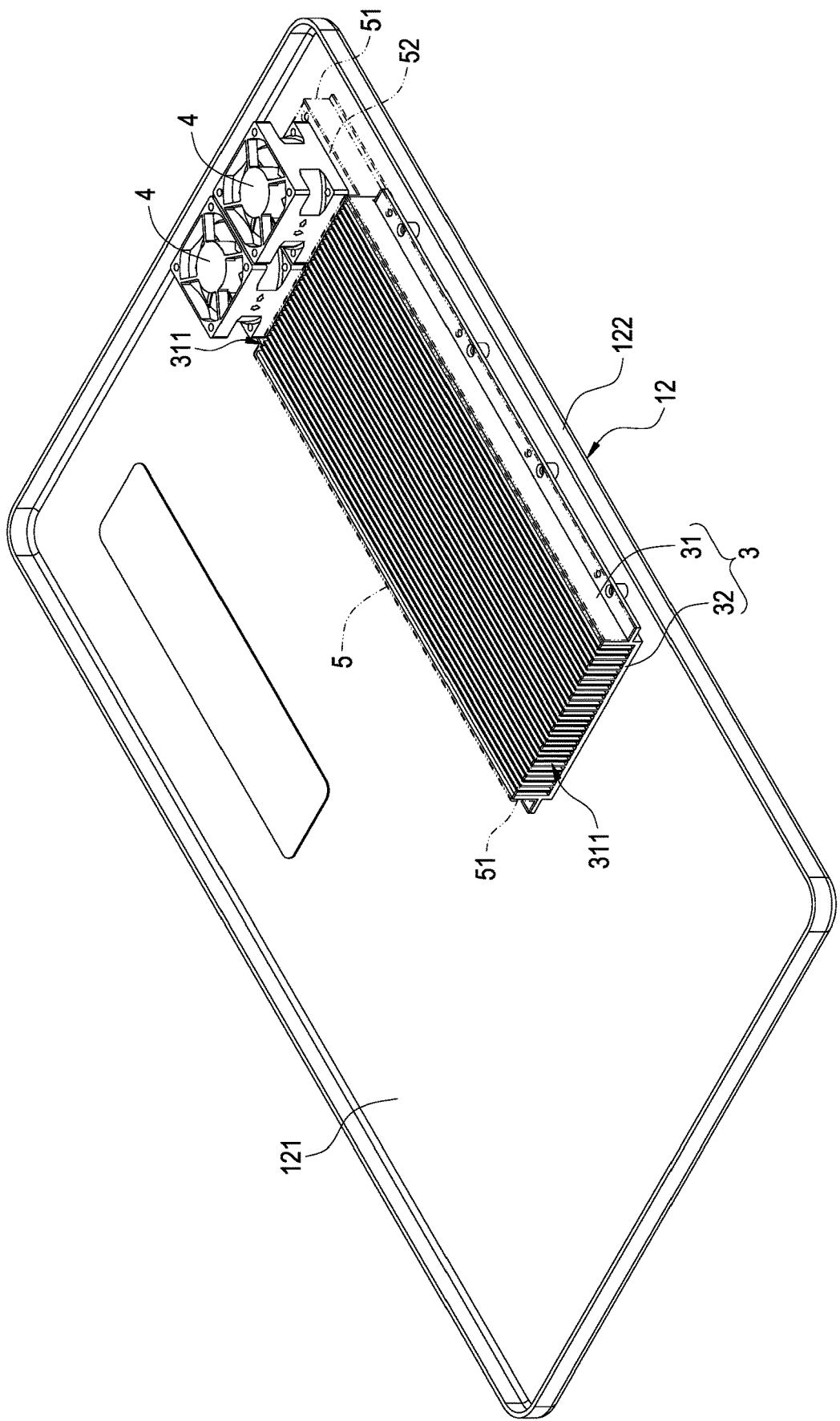
FIG. 2 is a perspective view showing the cover, heat dissipation structure and fan assembled with each other according to the present disclosure.
Figure 3:
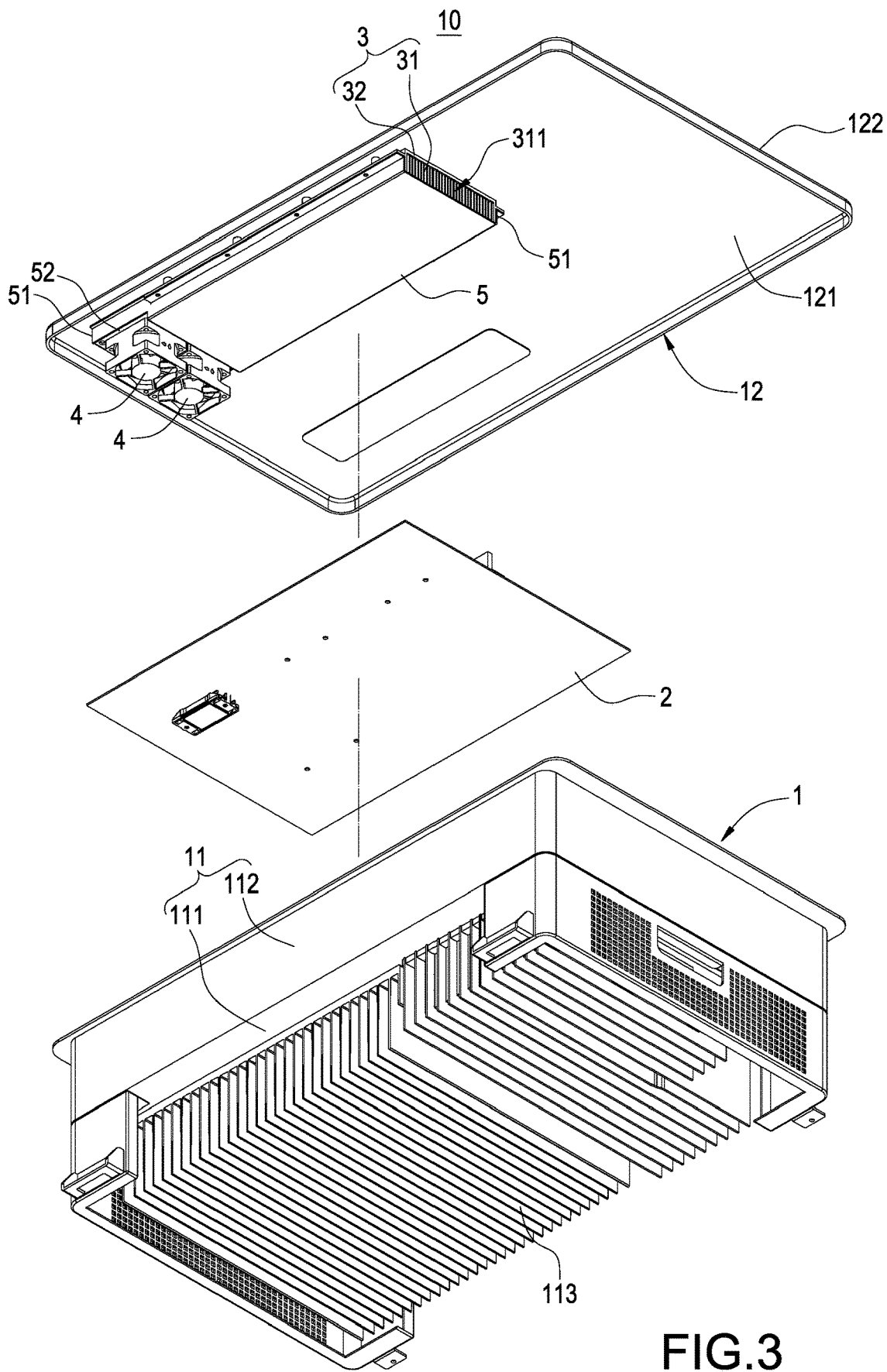
FIG. 3 is an exploded view showing the heat dissipation structure according to the present disclosure.
Figure 4:
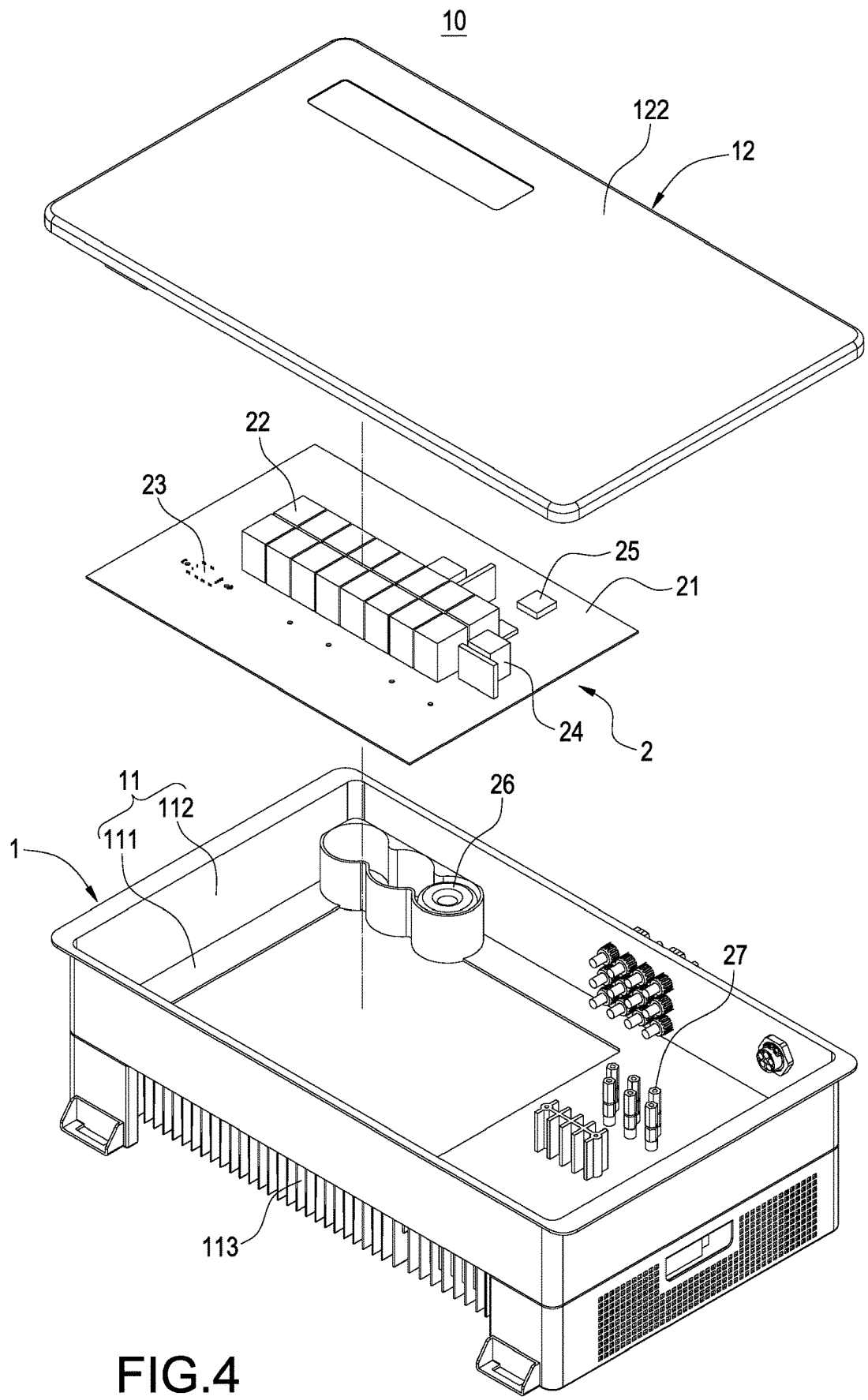
FIG. 4 is another exploded view showing the heat dissipation structure of the present disclosure according to the present disclosure.
Figure 5:
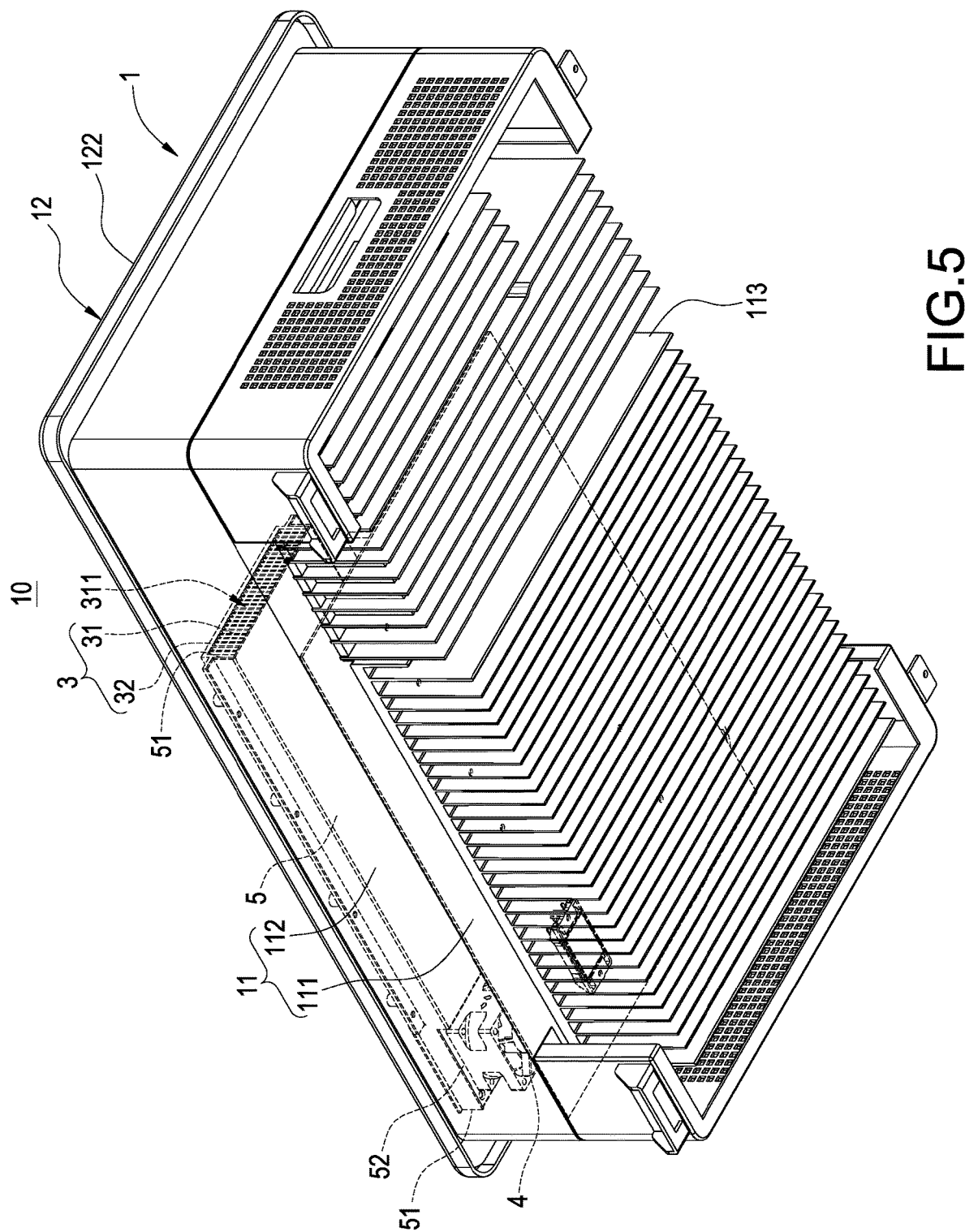
FIG. 5 is a perspective view showing the assembled heat dissipation structure according to the present disclosure.
Figure 6:
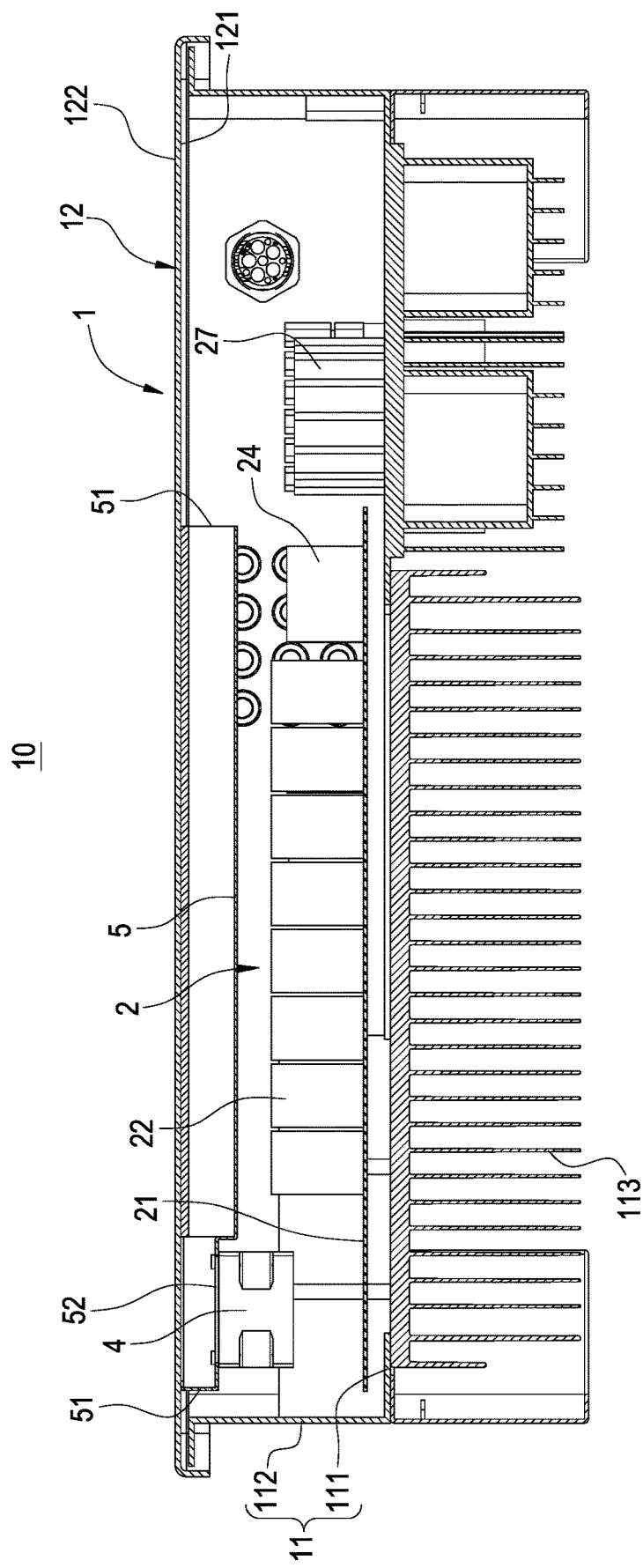
FIG. 6 is a cross sectional view of the heat dissipation structure according to the present disclosure.
Figure 7:
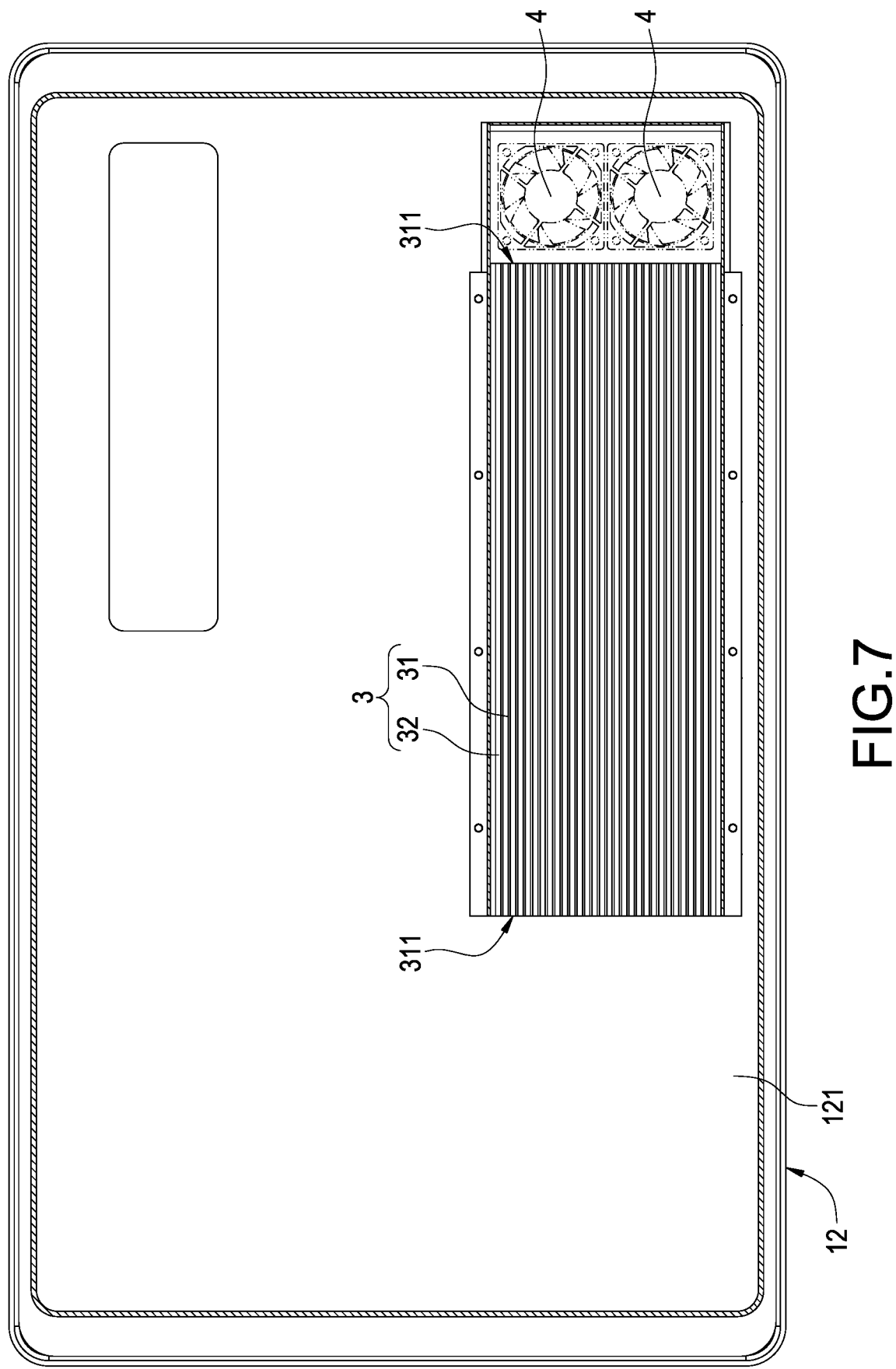
FIG. 7 is a bottom view showing the cover according to the present disclosure.

The present disclosure can be more fully understood by reading the following detailed description of the embodiment, with reference made to the accompanying drawings. However, scopes of the present disclosure should not be limited thereby.

According to an inverter device having a heat dissipation mechanism shown in FIGS. 1 to 7 of the present disclosure, an inverter device 10 mainly has a casing 1, one or a plurality of heat source elements 2, a heat dissipation structure 3 and one or a plurality of fans 4.

According to FIGS. 1 to 7, the casing 1 has a base 11 and a cover 12, the base 11 is covered by the cover 12, an internal surface 121 and an external surface 122 are oppositely defined on the cover 12, and the internal surface 121 is arranged corresponding to the base 11.

Specifically, the base 11 has a bottom wall 111 and a lateral wall 112 surrounding the bottom wall 111. The internal surface 121 is arranged corresponding to the bottom wall 111. A plurality of aiding fins 113 is one piece extended from or bonded on an external side of the bottom wall 111, and the plurality of aiding fins 113 is used for dissipation heat accumulated in the bottom wall 111.

According to present embodiment shown in FIGS. 3 and 4 to 6, a plurality of heat source elements 2 is provided, the respective heat source elements 2 are accommodated in the casing 1 and arranged on the bottom wall 111 of the base 11. The heat source elements 2 are electronic elements of the inverter device 10. the plurality of heat source elements 2 includes a circuit board 21, a plurality of capacitors 22, power semiconductor components 23 such as IGBTs or MOSFETs, relay(s) 24, common mode choke(s) 25 and inductor(s) 26. The circuit board 21 is fixed on the bottom wall 111, and the capacitors 22, the power semiconductor components 23 such as IGBTs or MOSFETs, the relay(s) 24 and the common mode choke(s) 25 are fixed on the circuit board 21. Furthermore, according to the present embodiment, the inductor(s) 26 are arranged at one side of the circuit board 21 and fixed on the bottom wall 111, but scopes of the present disclosure should not be limited thereby, the inductor(s) 26 alternatively could be fixed on the circuit board 21. Heat generated by the aforementioned respective heat source elements 2 are transferred to the bottom wall 111 and further dissipated from the aiding fins 113.

Accordingly, the power semiconductor components 23 such as IGBTs or MOSFETs are used as switches of a power conversion circuit such as DC/AC or DC/DC conversion circuits. The relay (Relay) 24 is used to disconnect external power input. The common mode choke 25 is a common mode inductor used to solve Electromagnetic Interference (EMI). Furthermore, a plurality of supporting columns 27 fixed on the bottom wall 111 and arranged at one side of the circuit board 21 is accommodated in the casing 1, and the supporting column 27 is used for electrical connection, supporting the circuit board 21 or other circuit board(s).

Moreover, the number of the circuit board 21 is not limited to one according to aforementioned embodiment, a plurality of circuit boards 21 alternatively could be provided. The plurality of circuit boards 21 could be fixed on the bottom wall 111 and arranged in a plane or in a stack, and the plurality of capacitors 22, the power semiconductor components 23, and the relays 24, and the common mode chokes 25 are respectively fixed on the circuit boards 21.

Furthermore, when the aforementioned plurality of circuit boards 21 is provided, one part of the plurality of capacitors 22, the power semiconductor components 23, the relays 24 and the common mode chokes 25 could be arranged on the same circuit board, and another part of the plurality of capacitors 22, the power semiconductor components 23, the relays 24 and the common mode chokes 25 could be arranged on another circuit board(s). Accordingly, the inductor(s) 26 could be arranged at one side of the circuit board 21 or fixed on one of the circuit boards 21.

According to FIGS. 1 to 3, 5 and 7, the heat dissipation structure 3 is thermally contacted with the internal surface 121. According to the heat dissipation structure 3 shown in the present embodiment, the heat dissipation structure 3 includes a plurality of heat dissipation fins 31 and a heat conductive plate 32. One surface of the heat conductive plate 32 is thermally contacted with the internal surface 121, and a plurality of heat dissipation fins 31 is connected to the other surface of the heat conductive plate 32. The plurality of heat dissipation fins 31 is arranged with each other and two vents 311 are thereby defined corresponding to two ends of the heat dissipation fins 31. However, scopes of the present disclosure should not be limited to the embodiment.

Furthermore, the heat dissipation structure 3 could be a vapor chamber or include a vapor chamber, and the vapor chamber is thermally contacted with the internal surface 121.

Alternatively, the heat dissipation structure 3 could be a heat pipe or include a heat sink and one or a plurality of heat pipes, and the heat sink is thermally contacted with the internal surface 121 and the heat pipes are inserted into the heat sink.

Moreover, the heat conductive plate 32 is fixed on the internal surface 121 by adhesive od screw according to the present embodiment, namely the heat conductive plate 32 and the cover 12 could be assembled in two separated parts. However, scopes of the present disclosure should not be limited thereby, the heat conductive plate 32 and the cover 12 alternatively cloud be one piece formed.

According to the present embodiment shown in FIGS. 1 to 3, 5 and 7, a fan 4 is accommodated in the casing 1 and arranged corresponding to one of the vents 311. However, scopes of the present disclosure should not be limited thereby, the fan 4 could be arranged anywhere in the casing 1, but the fan 4 should be arranged corresponding to position of the heat dissipation structure 3 and airflow driven by the fan 4 should flow through heat dissipation structure 3.

Accordingly, the fan 4 is used to accelerate airflow in the casing 1, and the heat dissipation structure 3 is used to absorb heat from the air in the casing 1 and transfer the heat to the external surface 122 of the cover 12.

According to FIGS. 1 to 3, 5 and 6, the inverter device 10 according to the present disclosure further includes an air shroud 5. The air shroud 5 is fixed on the internal surface 121 and the plurality of heat dissipation fins 31 is covered thereby. Two openings 51 are defined on the air shroud 5 corresponding to the two vents 311, and an extension segment 52 arranged between one of the openings 51 and the plurality of heat dissipation fins 31 is defined on the air shroud 5. The fan 4 is arranged on the extension segment 52, and the fan 4 is therefore arranged corresponding to one of the openings 51.

According to the operated inverter device 10 shown in FIGS. 1 to 7 of the present disclosure, the heat dissipation structure 3 is thermally contacted with the internal surface 121 of the cover 12. The fan 4 is arranged corresponding to the heat dissipation structure 3, airflow in the casing 1 is accelerated by the fan 4 and driven to flow through the heat dissipation structure 3, and heat is absorbed from the airflow via the heat dissipation structure 3 and the heat is further transferred to the external surface 122 of the cover 12. Thereby, heat could be more efficiently dissipated from the inverter device 10 through the cover 12 in relatively low temperature. Therefore, an efficiency of heat dissipation of the inverter device 10 is improved and the inverter device 10 is more durable.

Moreover, the inverter device 10 of the present disclosure further includes an air shroud 5 covering the plurality of heat dissipation fins 31. Two openings 51 are defined on the air shroud 5, the fan 4 is arranged corresponding to one of the openings 51, and the airflow driven by the fan 4 thereby could be guided to flow through the heat dissipation structure 3 and heat could be more efficiently transferred to the heat dissipation structure 3.

Figure 8:
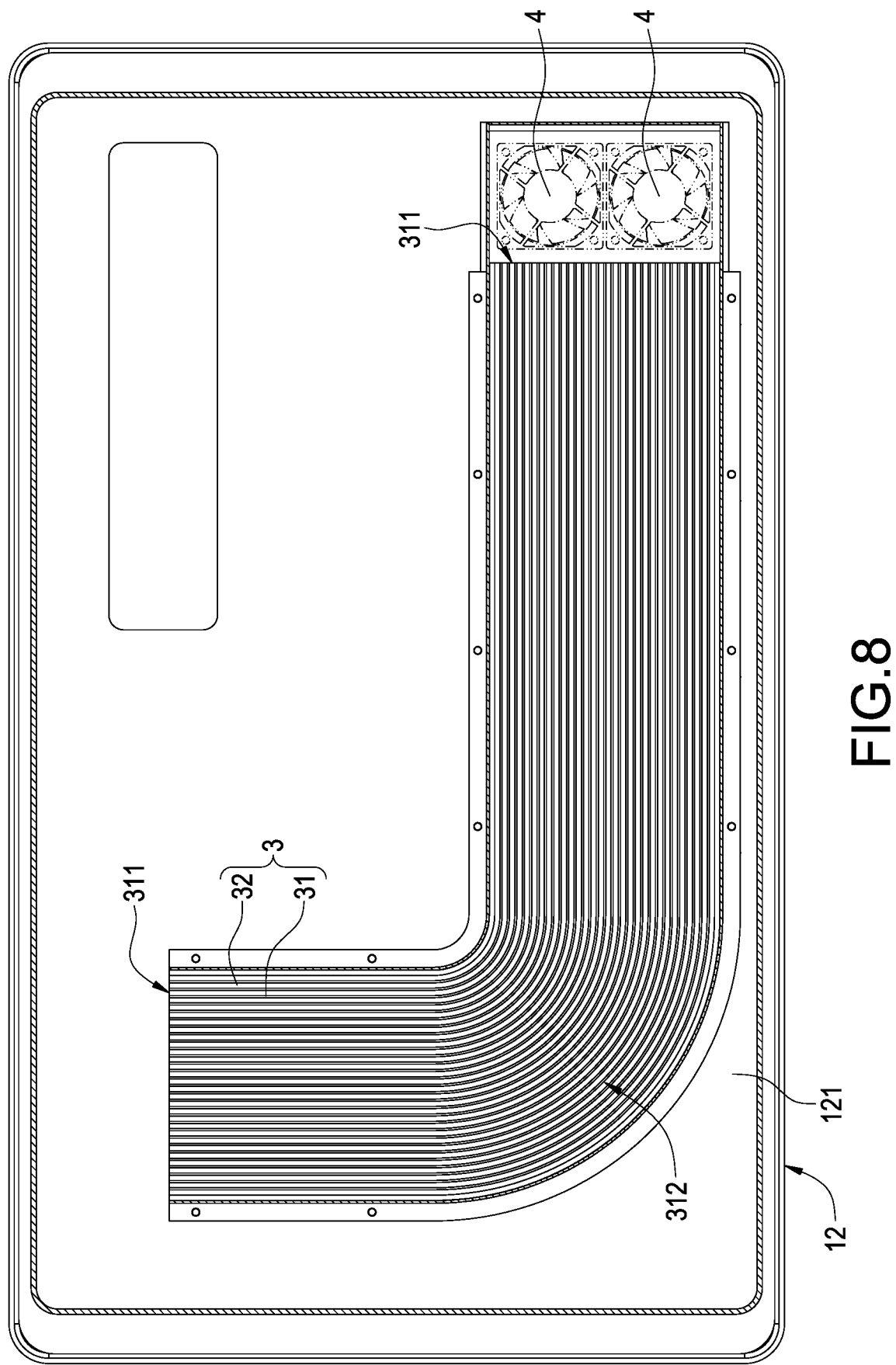
FIG. 8 is a bottom view showing the cove according to another embodiment of the present disclosure.

According to another embodiment of the present disclosure shown in FIG. 8, the inverter device 10 is almost the same as the embodiments shown in FIGS. 1 to 7, the difference between the embodiment shown in FIG. 8 and the embodiment shown in FIGS. 1 to 7 is that the plurality of heat dissipation fins 31 is bent to form one or a plurality of curved segments 312. The curved segments 312 are arranged on the cover 12 for turning extending direction, and an area for heat exchange of the plurality of heat dissipation fins 31 is thereby extended, and air flow channels are extended so that the heat is maintained in the heat dissipation structure 3 and further dissipated via the cover 12.

Figure 9:
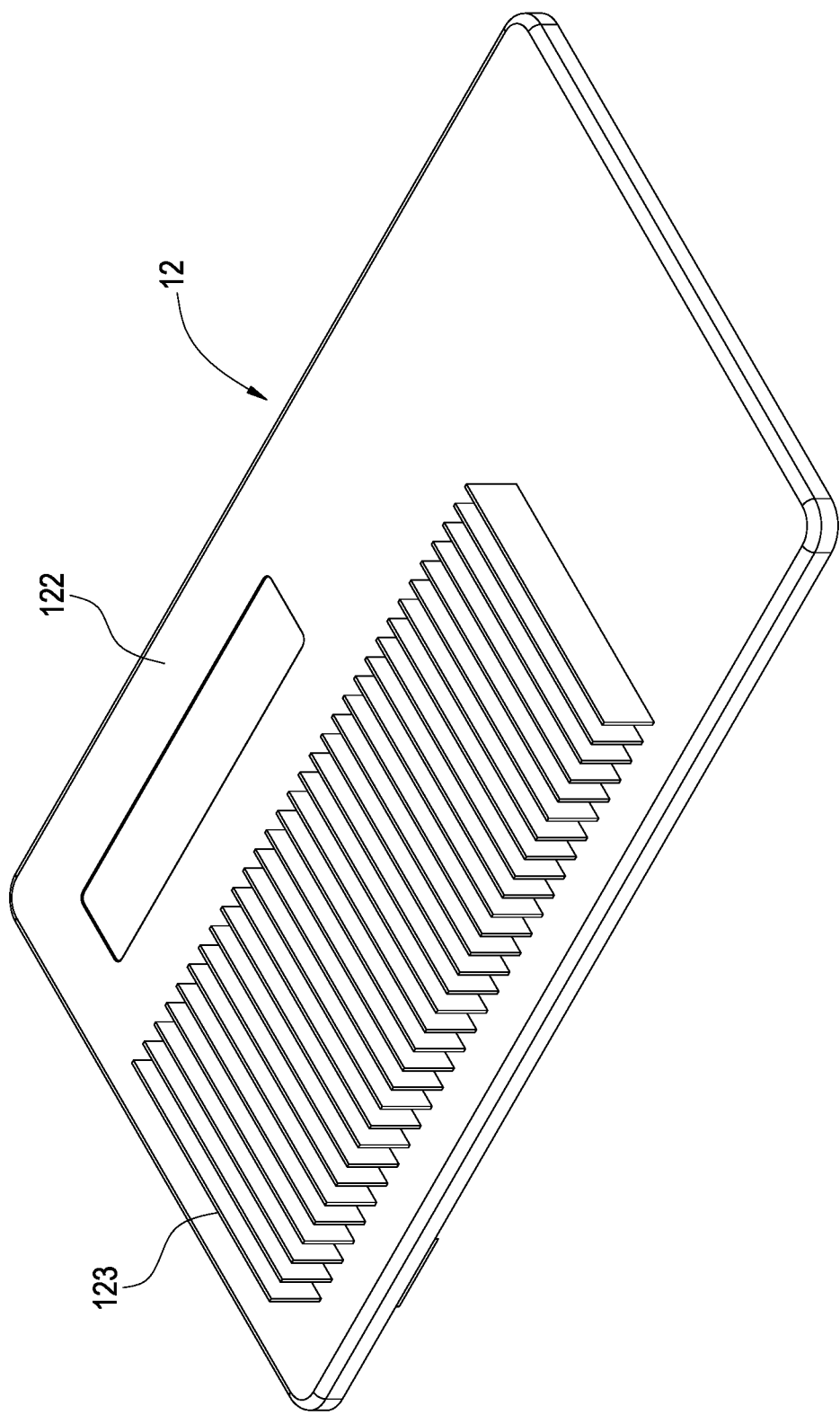
FIG. 9 is a perspective view showing the cover according to further another embodiment of the present disclosure.

According to further another embodiment of the present disclosure shown in FIG. 9, the inverter device 10 is almost the same as the embodiment FIGS. 1 to 7, the difference between the embodiment shown in FIG. 9 and the embodiments shown in FIGS. 1 to 7 is that a plurality of aiding fins 123 is one piece extended from or bonded on the external surface 122 of the cover 12, and heat could be dissipated from the cover 12 via the plurality of aiding fins 123. The heat dissipation structure 3 is thermally contacted with the internal surface 121 of the cover 12, and the aiding fins 123 are therefore not necessary to be disposed to cover the entire external surface 122. Namely, it is enough to efficiently dissipate heat from the cover 12 by disposing the aiding fins 123 to cover only one part of the external surface 122, and the heat is thereby prevented from being accumulated in the cover 12.

In conclusion, the inverter device having heat dissipation mechanism according to the present disclosure is neither disclosed in similar products nor used in public, and it is novel, inventive and able to be applied in industry. The present disclosure meets requirement of patentability. In order to protect right of the applicant, the applicant filed an application according to the patent law, and the applicant respectfully requests for consideration and looks forward to be grant.

What is claimed is:

1. An inverter device having a heat dissipation mechanism, characterized in that the inverter device comprising:
    a casing comprising a base and a cover covering on the base, an internal surface and an external surface being oppositely defined on the cover, and the internal surface being arranged corresponding to the base;
    at least one heat source element accommodated in the casing and arranged on the base;
    a heat dissipation structure thermally contacted with the internal surface;
    at least one fan accommodated in the casing and arranged corresponding to the heat dissipation structure; and
    an air shroud is disposed between the internal surface and the base for covering the heat dissipation structure, two openings are defined on two opposite sides of the air shroud, and the fan is arranged corresponding to one of the openings;
    wherein a bottom wall and a lateral wall surrounding the bottom wall are defined on the base, the heat source element is arranged on the bottom wall, the internal surface is arranged corresponding to the bottom wall, a plurality of aiding fins is connected to an external side of the bottom wall, the number of the at least one heat source element is plural, the plurality of heat source elements comprise at least one circuit board, a power semiconductor component and a relay.

2. The inverter device having the heat dissipation mechanism according to claim 1, wherein the fan is used for accelerating an airflow in the casing, the heat dissipation structure is used for absorbing heat from air in the casing and transferring the heat to the external surface of the cover.

3. The inverter device having the heat dissipation mechanism according to claim 1, wherein the heat dissipation structure comprises a plurality of heat dissipation fins and a heat conductive plate, one surface of the heat conductive plate is thermally contacted with the internal surface and the other surface of the heat conductive plate is connected with the plurality of heat dissipation fins.

4. The inverter device having the heat dissipation mechanism according to claim 3, wherein the plurality of heat dissipation fins is arranged parallel with each other and two vents are defined corresponding to two ends of the heat dissipation fins, and the fan is arranged corresponding to one of the vents.

5. The inverter device having the heat dissipation mechanism according to claim 4, wherein the air shroud is fixed on the internal surface for covering the plurality of heat dissipation fins, the two openings are corresponding to the two vents.

6. The inverter device having the heat dissipation mechanism according to claim 5, wherein an extension segment is arranged between one of the openings and the plurality of heat dissipation fins is defined on the air shroud, and the fan is arranged on the extension segment.

7. The inverter device having the heat dissipation mechanism according to claim 3, wherein the plurality of heat dissipation fins is bent to form a curved segment.

8. The inverter device having the heat dissipation mechanism according to claim 3, wherein the heat conductive plate and the cover are formed in one piece.

9. The inverter device having the heat dissipation mechanism according to claim 3, wherein the heat conductive plate is fixed on the internal surface by adhesive or a screw.

10. The inverter device having the heat dissipation mechanism according to claim 1, wherein the plurality of heat source elements comprise a plurality of capacitors, a common mode choke and an inductor, the circuit board is fixed on the bottom wall, the plurality of capacitors, the power semiconductor component, the relay, the common mode choke are fixed on the circuit board, and the inductor is arranged at one side of the circuit board or fixed on the circuit board.

11. The inverter device having the heat dissipation mechanism according to claim 1, wherein the plurality of heat source elements comprise a plurality of capacitors, a common mode choke and an inductor, the number of the at least one circuit board is plural, the plurality of circuit boards is fixed on the bottom wall, the plurality of capacitors, the power semiconductor component, the relay, the common mode choke are arranged on the respective circuit boards, the inductor is arranged at one side of the circuit boards or fixed on one of the circuit boards.

12. The inverter device having the heat dissipation mechanism according to claim 1, wherein a plurality of aiding fins is connected on the external surface of the cover.

* * * * *